(12) United States Patent
McElwee et al.

(10) Patent No.: US 7,340,662 B1
(45) Date of Patent: Mar. 4, 2008

(54) GBIT/S TRANSCEIVER WITH BUILT-IN SELF TEST FEATURES

(76) Inventors: James Francis McElwee, 1201 Cullen Ave., Austin, TX (US) 78757; Eric Kimball, 6528 Walebridge La., Austin, TX (US) 78739; John James Paulos, 7922 Jester Blvd., Austin, TX (US) 78750; Magesh Valliappan, 3517 N. Hills Dr., E104, Austin, TX (US) 78731

( * ) Notice: Subject to any disclaimer, the term of this patent is extended or adjusted under 35 U.S.C. 154(b) by 701 days.

(21) Appl. No.: 10/428,326

(22) Filed: Apr. 30, 2003

(51) Int. Cl.
*G01R 31/3167* (2006.01)
*G01R 31/40* (2006.01)

(52) U.S. Cl. .................................. 714/742; 714/733

(58) Field of Classification Search ............... 714/742, 714/716, 733, 25, 30, 27, 48, 56; 375/371
See application file for complete search history.

(56) References Cited

U.S. PATENT DOCUMENTS

| | | | | |
|---|---|---|---|---|
| 4,396,894 A * | 8/1983 | Willmore | ...................... | 331/78 |
| 5,267,262 A * | 11/1993 | Wheatley, III | .............. | 455/522 |
| 5,659,312 A * | 8/1997 | Sunter et al. | ................ | 341/120 |
| 6,154,836 A | 11/2000 | Dawson, III et al. | | |
| 6,298,458 B1 * | 10/2001 | Cranford et al. | ............ | 714/716 |
| 6,304,900 B1 * | 10/2001 | Cromer et al. | .............. | 709/221 |
| 6,459,746 B2 * | 10/2002 | Agazzi et al. | .............. | 375/371 |
| 6,623,186 B2 | 9/2003 | Rumer | | |
| 2002/0159115 A1 | 10/2002 | Rumer | | |

FOREIGN PATENT DOCUMENTS

JP        62210769 A  *  9/1987

OTHER PUBLICATIONS

Antaki et al., Design for testability method for CML digital circuits, Jan. 1999, Proceedings of the conference on Design, automation and test in Europe DATE '99, Publisher: ACM Press.*

* cited by examiner

*Primary Examiner*—Cynthia Britt
*Assistant Examiner*—Dipakkumar Gandhi
(74) *Attorney, Agent, or Firm*—Christie, Parker & Hale, LLP (57) ABSTRACT

GBit/s transceiver with built-in self test features. A method is disclosed for testing the operation of a transceiver having a digital processing section and an analog section, each having a transmit portion and a receive portion, the analog portions adaptable to interface with an analog network. The transceiver is first configured to operate in a test mode. In the test mode, the transmit portion of the digital processing section is activated to generate data to be transmitted by the transmit portion of the analog section. The receive portion of the analog section and the receive portion of the digital processing section are operated to receive data. Thereafter, the parametrics of select portions of the receive portion of the digital processing section are examined during the receipt of data by the receive portion of the analog section and processing thereof by the receive portion of the digital processing section.

20 Claims, 7 Drawing Sheets

GBIT/S TRANSCEIVER WITH BUILT-IN SELF TEST FEATURES

TECHNICAL FIELD OF THE INVENTION

The present invention pertains in general to high speed data transmission and convergent systems and, more particularly, to a built-in self test (BIST) GBit/s transceiver.

BACKGROUND OF THE INVENTION

Transceivers of the type utilized in high speed data transmission typically require some type of analog front end that requires an analog driver for driving a transmission line for transmission of data thereto and an analog receiver for receiving data therefrom. Digital systems precede the analog transmitter for receiving and digitally processing input digital information, converting that digital information to analog information and then passing it through the analog transmitter. Similarly, the digital processing section also converts the received analog data to digital data for processing thereof. However, during manufacturing, especially with respect to very high speed transceiver designs such as those found in GBit/s transceivers, the operating characteristics of the analog section are important in order to meet the specifications of the various standards associated therewith.

In order to test devices during and after manufacture, various types of Automatic Test Equipment (ATE) have been utilized. However, analog ATE can be very expensive and slow. In some instances, the transceiver utilizes its transmission and receive paths in a loopback configuration to actually test the entire transmission path on a limited basis. As an alternative to utilizing an external ATE, some functionality of the testing operation can be built into the device. However, this sometimes requires the use of additional testing circuitry that adds to the cost, the area and the complexity of the device.

SUMMARY OF THE INVENTION

The present invention disclosed and claimed herein, in one aspect thereof, comprises a method for testing the operation of a transceiver having a digital processing section and an analog section, each having a transmit portion and a receive portion, the analog portion adaptable to interface with an analog network. The analog section is first configured to operate in a test mode. In the test mode, the transmit portion of the digital processing section is activated to generate data to be transmitted by the transmit portion of the analog section. The receive portion of the analog section and the receive portion of the digital processing section operating to receive data. Thereafter, the parametrics of select portions of the receive portion of the digital processing section are examined during the receipt of data by the receive portion of the analog section and processing thereof by the receive portion of the digital processing section.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
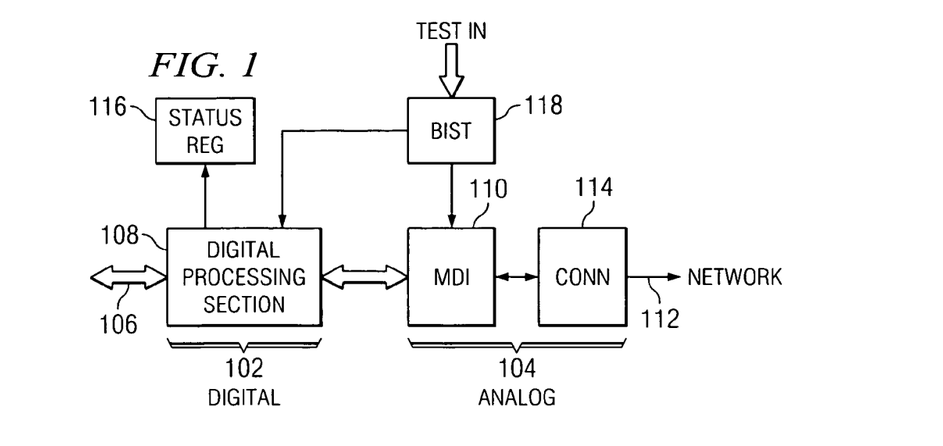
FIG. 1 illustrates an overall block diagram of a high speed transceiver with BIST.

Referring now to FIG. 1, there is illustrated a diagrammatic view of a transceiver utilizing the built-in self test (BIST) system of the present disclosure. The GBit/s transceiver illustrated comprises a portion of a 10/100/1,000 BASE-T network interface adapter of the type utilized to interface with an Ethernet network. The portion illustrated comprises the physical layer architecture which typically utilizes an interface with a Media Access Controller (MAC) (not shown) and which physical layer architecture is referred to as the "PHY." This PHY is typically comprised of a digital section 102 and the analog section 104. Digital section 102 is operable to interface through a digital interface 106 with a MAC for transmitting and receiving data. Typically, some type of encoder is provided in a digital signal processing section (DSP) 108, which comprises the bulk of the digital section 102. The digital processing section is operable to interface with a Media Dependent Interface which interfaces the digital input/output of the Digital Processing Section (DPS) DSP 108 with the analog domain. An analog Ethernet network 112 is provided that is interfaced with the MDI 110 through a connector 114. The connector 114 is typically of the type RJ 45. The MDI 110 typically includes a transformer section utilizing magnetics, in addition to an analog driver and an analog receiver, these being conventional.

As will be described hereinbelow, there are a number of functional blocks that are contained within both the MDI 110 and the digital processing section 108 that can be controlled. Various registers in the digital processing section 108 are provided during the normal operation thereof, and additional registers are added for the purpose of the testing operation of the present disclosure. The performance, filter coefficient, state information, etc., is generally stored in these plurality of registers, represented by block 116. The overall configuration and operation of the BIST is provided by a BIST block 118 that is operable to provide control information to the digital processing section 108 and the MDI 110 and also to receive test input data, as will be described in more detail herein below. In general, the analog front end associated with the MDI 110 can be tested to determine if it operates within predetermined operating parameters utilizing existing circuitry that already exists within both the receive portion of the MDI 110 and also within the receive portion of the digital processing section 108.

Figure 2:
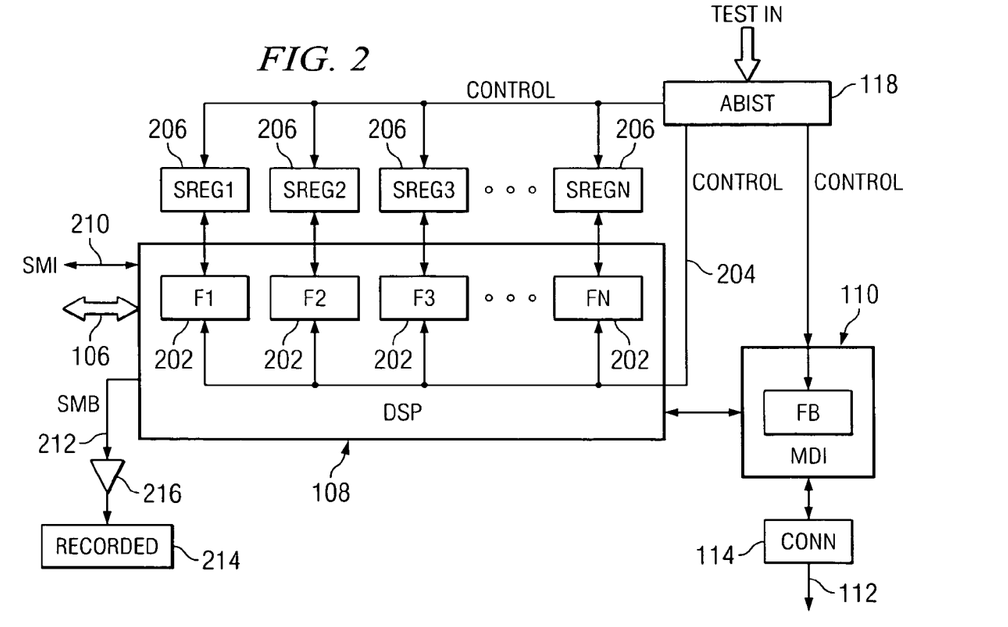
FIG. 2 illustrates a more detailed diagrammatic view of the functionality of the BIST.

Referring now to FIG. 2, there is illustrated a more detailed diagram of the DSP 108 and the MDI 110. The DSP 108 has a plurality of functional blocks 202 associated therewith. In a transmit operation, these functional blocks can include functions such as the DAC function, the serializer function, etc. and, in the receive operation, these can include such things as the DC filter, the echo canceller, the Decision Feedback Equalizer (DFE), the slicer, etc. Any or all of these functional blocks 202 can be interfaced by the BIST 118 through interface lines 204 that allow the functional blocks to be reconfigured for test purposes, have the contents thereof examined, etc., such that existing circuitry that is utilized in the normal operation mode of the DSP 108 can be utilized for the test operation. Each of these functional blocks 202 has associated therewith, in normal operation, various registers 206, i.e., the registers are required for the normal operation of the device. Some of these registers 206 can be added specifically for test purposes, i.e., they are added for the express purpose of the BIST operation. The contents thereof are accessible through the System Management Interface (SMI) bus 210, which is used during normal operations for configuration and data access operations. During BIST, the contents of these registers can be accessed and downloaded through a System Management Bus (SMB) 212, which allows information to be output from the registers 206, this being a serial data bus. When the information is transferred out on the SMB 212, it is buffered through a buffer 216 to an external recorder 214, which is utilized specifically for the test operation. However, it should be understood that certain processing information could be implemented within the DSP 108 and the information associated with the test could be stored therein for output therefrom at a later time.

There are three basic tests that are performed in association with the BIST, which tests can all be done in one testing procedure or select ones thereof performed on an individual basis. These tests are as follows:

| | |
|---|---|
| AFE Test: | DC test to check for Tx/Rx system linearity, offset, gain, faults (e.g., DAC faults, ADC missing codes). |
| ALOOP Test: | Dynamic test wherein a pseudo random sequence of pulses are transmitted and then looped back to the receive DSP. Adaptive filters in the receive DSP are trained to these pulses. The training results contain information about the system response. This test validates offset, noise, linearity, gain, as well as DSP function/speed. |
| Template Test: | Dynamic test which loops back pulses as in the ALOOP test. The adaptive echo filter is operable to train to the received pulse's shape and then the coefficients of the echo filter are compared to a prescribed (or required) template. This test validates dynamic behavior of the transmit path, the receive path, as well as proper training of the echo canceller. |

Figure 3:
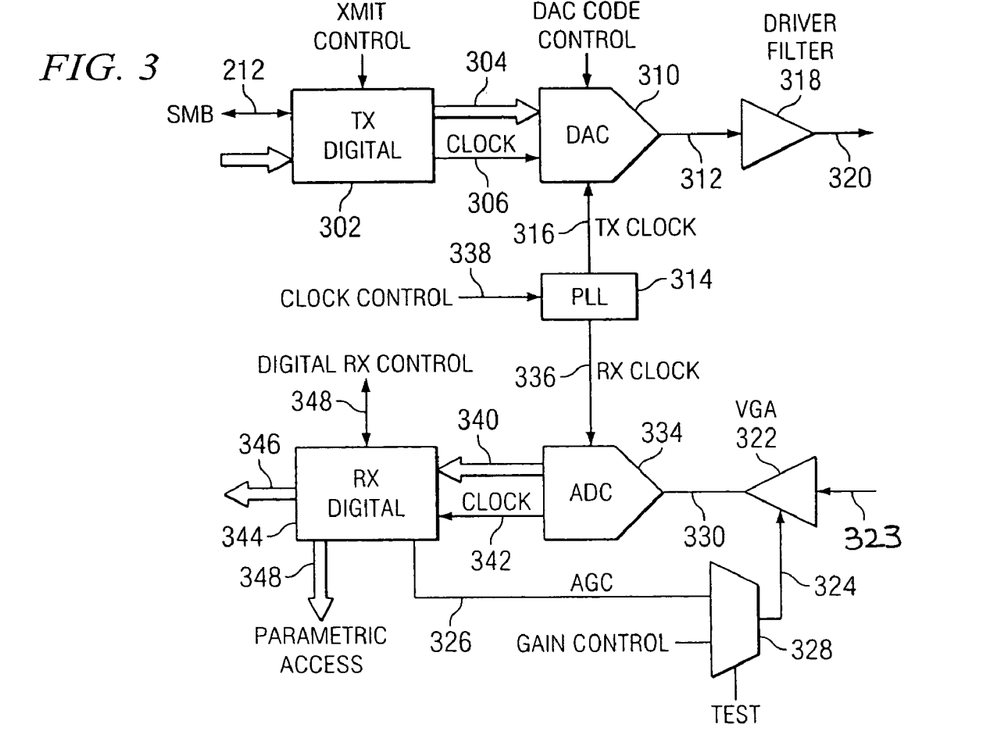
FIG. 3 illustrates a diagrammatic view of a portion of the analog and digital sections of the transceiver.

Referring now to FIG. 3, there is illustrated in more detail a diagram of the PHY. The digital portion includes a digital processing section 302 that typically includes such functions as a deserializer and a pseudo random scrambler in addition to the various encode blocks. The digital processing section 302 provides data out on a data bus 304 and clock information on a clock line 306. This is input to a DAC 310, which is a current DAC that is operable to convert the digital information to analog information on an analog drive line 312. The DAC 310 operates in conjunction with a transmit clock that is received from a Phase Lock Loop (PLL) 314 that provides a transmit clock on a line 316 to the DAC 310. The analog drive line 312 is input to a driver/filter block 318 that is operable to convert the output of the current DAC 310 to a voltage to provide the analog transmit signal on an analog transmit line 320. The receive section includes a Variable Gain Amplifier (VGA) 322 that is operable to receive data on an analog data line 323, which VGA 322 has a controllable gain controlled by a signal on a control line 324. The gain control line 324, during normal operation, is controlled by an AGC signal on a line 326 which is connected to the line 324 through a multiplexer 328. The multiplexer 328 is operable to receive on a second input thereof a gain control signal for controlling the gain of the VGA 322 during test operation, as will be described hereinbelow.

The output of the VGA 322 is provided on an analog output line 330 for input to an ADC 334. The ADC is typically a flash analog-to-digital converter, although it should be understood that other types of ADCs could be utilized. Flash ADC is typically comprised of an analog section and a digital section. The analog section consists generally of a reference source, a plurality of comparators connected in parallel and a plurality of equally valued resistors providing reference voltages thereto. Typically, there is a single comparator for each level in the flash ADC, in addition to a preamplifier associated therewith. A digital section consists of an encoder for sampling comparator output signals, correcting faulty code sequences and obtaining the binary output code, and a register for storing the code. This ADC 334 is clocked with a receive clock on a line 336, which is output from the PLL 314. As will be described herein below, the PLL 314 is controlled by a clock control signal on a line 338 that has the ability to change the phase relationship between the transmit and receive clocks. During normal operation, the independence of the receive clock and the transmit clock is required in order to allow the transceiver to operate in a slave mode or a master mode, depending upon which end of the transmission line the transceiver is disposed. It should also be understood that, although not shown, the PLL 314 is referenced to an external clock reference. In general with respect to a 1000 BT transceiver, when the transceiver is configured as a master, its transmit clock is fixed in phase with respect to its receive clock. Therefore, on the opposite end, the receiver will be part of a slave transceiver and will be synchronized with the transmit clock of the master through clock recovery. In the slave, the transmit clock is synchronized to the receiver in the slave transceiver, which is synchronized to the transmit clock in the master transceiver. This allows the receiver in the master transceiver to have its receive clock synchronized with the transmit clock of the transmitter in the slave transceiver in order to properly receive data sent by the transmitter in the slave transceiver. Because of the synchronization of the receive and transmit clocks of the slave (not shown) to the transmit clock of the transmitter of the master transceiver, the receive clock of the receiver in the master transceiver is synchronized to the transmit clock of the transmitter of the master transceiver with a phase delay such that, after synchronization, the receive clock on line 336 in the master transceiver will track the transmit clock on line 316 in the master transceiver. Thus, during normal operation, there is a requirement that the PLL 314 have the ability to have the clock thereof phase delayed. As will be described hereinbelow, this is facilitated with the use of phase taps.

The output of the ADC 334 provides a digital output on a bus 340 and a clock output on a clock line 342, which are both input to a receive digital portion 344 "receive DSP," which provides a digital output on a bus 346 for interfacing with the MAC (not shown). In addition, there are provided various outputs on a bus 348, which comprises the access to the registers 206 associated with the various functional blocks in the digital portion of the receiver. There will be provided control signals to the digital portion 344 on a line 348 that will be controlled by the BIST 118.

During tests, the digital portion of the transmitter, digital portion 302, can be controlled to generate various inputs for input to the DAC 310. The DAC 310 can, alternatively, be controlled to receive internally generated predetermined DAC codes. The VGA 322 can have the gain thereof forced to predetermined levels for certain tests wherein these tests will then result in various registers being changed. The register information in these registers can then be reviewed. All of this will be described hereinbelow in more detail. Additionally, the PLL 314 can have the phase relationship between the receive and transmit clocks controlled by the BIST for select one(s) of the tests.

Figure 4:
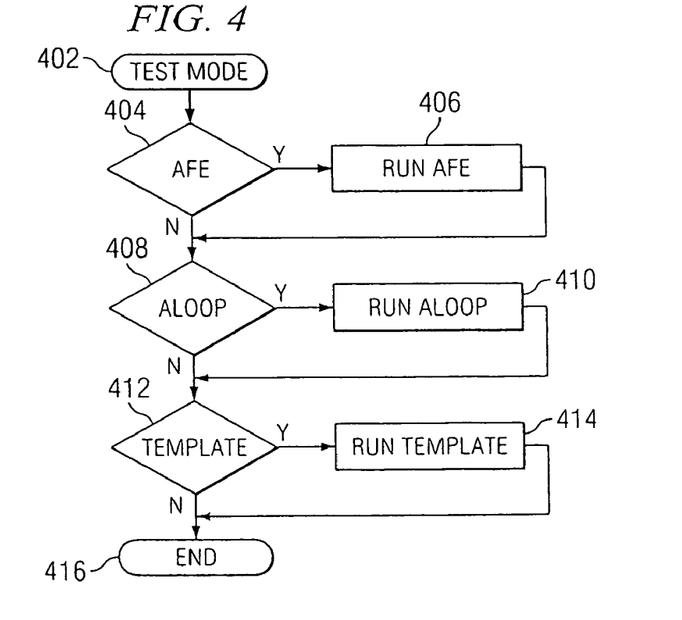
FIG. 4 illustrates a flow chart depicting the test mode for operating the BIST.

Referring now to FIG. 4, there is illustrated a flow chart depicting one embodiment of a test mode operation that illustrates a procedure where substantially all of the tests are run, which is initiated at a block 402 and then proceeds to a decision block 404. Decision block 404 determines whether the AFE test is to be run. If so, the program flows along the "Y" path to a function block 406 to run the AFE test. If not, the program flows along the "N" path to a decision block 408 to run the ALOOP test, the function block 406 also returning to the input of block 408. If the ALOOP test is to be run, the program will flow along a "Y" path to a function block 410 to run the ALOOP test. If not, the program flows along the "N" path to a function block 412 to determine if a Template test is to be run. The output of function block 410 also flows to block 412. At decision block 412, if the Template test is to be run, the program will flow along the "Y" path to a function block 414 to run the Template test and then to an END block 416. If the Template test is not to be run, the program 412 will flow along an "N" path to the END block 416. Although a fixed order is illustrated in the flow chart of FIG. 4, it should be understood that any number of the tests can be performed in any order and at any time.

Figures 5, 6, 7:
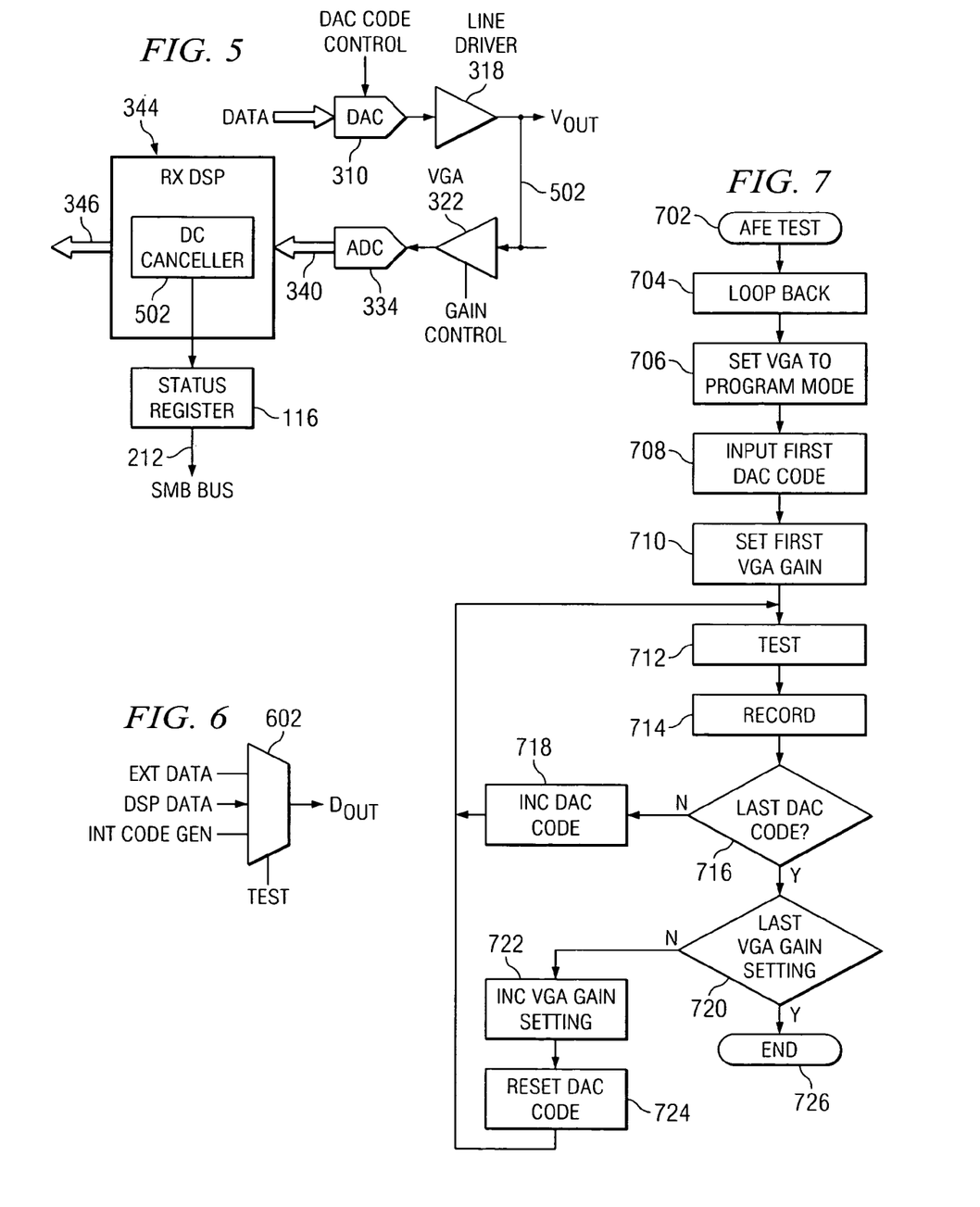
FIG. 5 illustrates a diagrammatic view of the analog front end test configuration.
FIG. 6 illustrates a detail of the input multiplexer to the DAC.
FIG. 7 illustrates a flow chart for the AFE test mode.

Referring now to FIG. 5, there is depicted a diagrammatic view of the configuration for running the AFE test. In this mode, only the DAC 310, line driver 318, VGA 322, ADC 334 and receive DSP 344 are illustrated. The line driver 318 is disclosed in U.S. patent application Ser. No. 09/894,388, filed Jun. 28, 2001 and entitled "OUTPUT DRIVER FOR HIGH SPEED ETHERNET TRANSCEIVER," which is incorporated herein by reference. The output of the line driver 318 is connected to the input of the VGA 322 through a loopback connection 502. This loopback connection 502 is typically always in place, as will be described herein below. The VGA 322 is, in the test mode, controlled to provide separate gain control from the AGC out of the receive DSP 344. In the AFE test operation, predetermined DAC codes are input to the DAC 310 and stepped therethrough to provide a voltage output $V_{out}$. This is input to the VGA 322 and the gain thereof set at predetermined levels and then this information processed in the receive DSP 344. The primary purpose of this test is to determine the presence of DAC faults, and ADC missing codes and DC linearity, offset and gain of the composite AFE. Therefore, all that is important is to determine the output of the ADC 334 at a DC level. The input to the DAC 310, i.e., the data associated therewith, can be internally generated or externally generated. This is facilitated with, in one embodiment, a multiplexer 602 illustrated in FIG. 6. This can receive external data or internally generated data for the test operation or, in normal operating mode, it merely receives the DSP data from the transmit DSP 302.

The DAC 310, in the disclosed embodiment, is operable to output all sum combinations of $\{-1.5, -0.75, 0, +0.75, +1.5\}+\{-0.5, -0.25, 0, +0.25, +0.5\}$. This will result in a maximum of twenty-five codes that can be stepped through, except that there is some redundancy. As such, there are only seventeen discrete and unique values of voltage from $-2$ to $+2$ for a voltage increment of 0.25 volts. The ADC 334, as disclosed hereinabove, is comprised of a plurality of comparators, one for each level. There are many (>100) code levels for the ADC 334, in this embodiment, that must be tested in order to determine that all of the comparators and associated preamplifiers are operational, i.e., the ADC 334 is operable at all code levels. In order to facilitate this, there must be more than seventeen discrete levels that can be provided by the DAC 310. With the use of the gain control in the VGA 322, the gain thereof can be varied such that the output of the VGA 322 is also varied. This will allow a larger number of output voltage levels to be provided as an input to the ADC 334, thus allowing more code levels in the ADC 334 to be exercised. The DAC 310 is therefore forced to a predetermined DC level and the receive DSP 344 will view this as a DC offset. In the receive DSP 334, there is provided a DC canceller 502, which is a conventional portion of the digital processing section in the receiver, which DC canceller 502 is operable to generate a DC offset. This DC offset is basically the value of the DC voltage $V_{out}$ as scaled by the gain of the VGA 322. The value of the offset can be stored in the registers 116 and then viewed through the SMI bus 210. Therefore, in order to step through various DC levels, the system must have the ability to force the DAC output 310 to a predetermined DC level, the ability to adjust the gain of the VGA and the ability to look at the values of the DC offset associated with the DC canceller 502. Additionally, the loopback circuitry is utilized. All of this circuitry is associated with the normal operation of the device, with the exception of the gain forcing this requiring little additional complexity to the device Referring now to FIG. 7, there is illustrated a flow chart depicting the operation of the AFE test. This is initiated at a block 702 and then proceeds to a block 704 to configure the loopback connection. The program then flows to a function block 706 in order to set the VGA 322 for a program mode wherein the gain thereof can be forced or programmed. The program then flows to a function block 708 in order to input the first DAC code in a sequence. The program then flows to a function block 710 in order to set the first value of the VGA gain and then to a function block 712 to perform a test, i.e., look at the value in the DC canceller register. The program then flows to a function block 714 to record this data point and then into a decision block 716 to determine if the current DAC code is the last DAC code. If not, this indicates that there are more DAC codes in the sequence and the program proceeds along the "N" path to the input of a function block 718 in order to increment the DAC code and then back to the input of the function block 712 to again test the output of the ADC 334. The program, when the last DAC code has been determined, flows from the decision block 716 along the "Y" path to a decision block 720 in order to determine if the current VGA setting is the last VGA gain setting in the sequence. If not, the program flows along a "N" path to a function block 722 in order to increment the value of the VGA gain setting. The program then flows to a function block 724 in order reset the DAC code back to the initial DAC code and then to the input of the test block 712. This continues until the last VGA gain setting has been processed, at which time the program will flow along the "Y" path from the decision block 720 to an END block 726. Although the sequence is illustrated as being a linear sequence, any combination of VGA gain settings and DAC codes in any order could be facilitated.

Figures 8, 9:
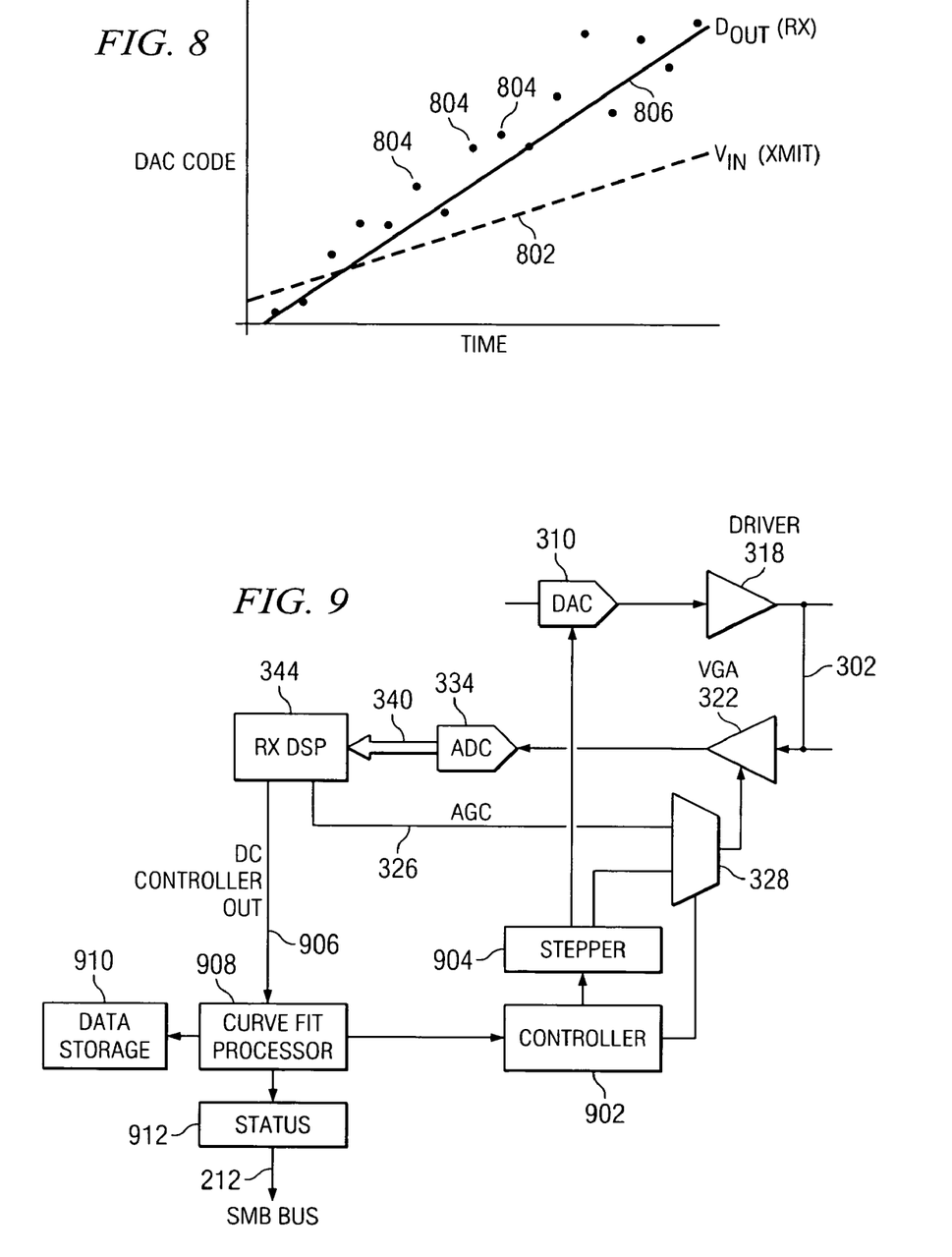
FIG. 8 illustrates an exemplary plot for the measured output of the AFE test.
FIG. 9 illustrates an alternate embodiment for configuring the transceiver for the AFE test.

Referring now to FIG. 8, there is illustrated a plot for one gain setting and the incrementing operation of the DAC code. In this operation, there is provided a plot 802 of DAC code vs. time. It can be seen that there are seventeen increments of the DAC code, with the voltage $D_{in}$ from the transmit side being input to the VGA 322. This results in a plurality of data points 804, one for each DAC code. Once the data points are determined, a best fit algorithm can be run to determine a best fit line 806 for the output data set. From this line, the DC output values from the ADC 334 (which were determined by looking at the output of the DC canceller 502) can be viewed and a determination made as to the overall DC offset, linearity and gain response of the analog front end. This can be facilitated by setting the gain to one value and then sweeping the DAC code or, alternatively, setting the DAC code to one value and then sweeping the gain. The gain of the VGA 322, as described hereinabove, has twenty-two VGA settings with the gain being set at $1.0625^{(-13\ \cdots\ +8)}$, which corresponds to a low gain of about −6 db=0.5.

Referring now to FIG. 9, there is illustrated an alternate embodiment of the BIST operation, specifically for the AFE test. In this embodiment, the fitting is performed "on-chip." A central controller 902 is provided that is operable to control the operation of the multiplexer 328 to select either normal operation or forced gain control of the VGA 322. The controller operates a stepper function block 904 that is operable to generate both the control for the DAC 310 to step through the seventeen DAC codes and also to step through the twenty-two gain settings of the VGA 322. For each step or combination of a DAC code and a gain setting on the VGA 322, the DC canceller provides an output on an output line 906, this basically being either the output of the associated register for the DC canceller 502 (not shown) or an input to an associated register. This signal is input to a curve fit processor block 908. The processor block 908 is operable to store all of the data points for the various steps in a data storage block 910. After the information is stored for a given data point, this is fed back to the controller 902 in order to increment to the next step, as set forth in the flow chart of FIG. 7. As soon as all of the steps are processed, the curve fit processor can obtain the best fit for each gain setting and then determine in accordance with predetermined parameters, whether the points fit within predetermined boundaries for linearity, gain and offset, i.e., it determines the performance of the overall analog front end based upon generation of DAC codes and various gain settings to determine if acceptable results were obtained. If the results were unacceptable, this could lead to a problem with manufacturing tolerances or simply a bad ADC level. The results are then loaded into a register 912, which could be as simple as a pass/fail flag. This is then output on the SMI bus 210. Alternatively, the register information in the form of a pass/fail could be output on a multiplexed pin during tests, wherein a pin on the integrated circuit utilized for some other function in normal operation, will be dedicated to a test flag.

Figure 10:
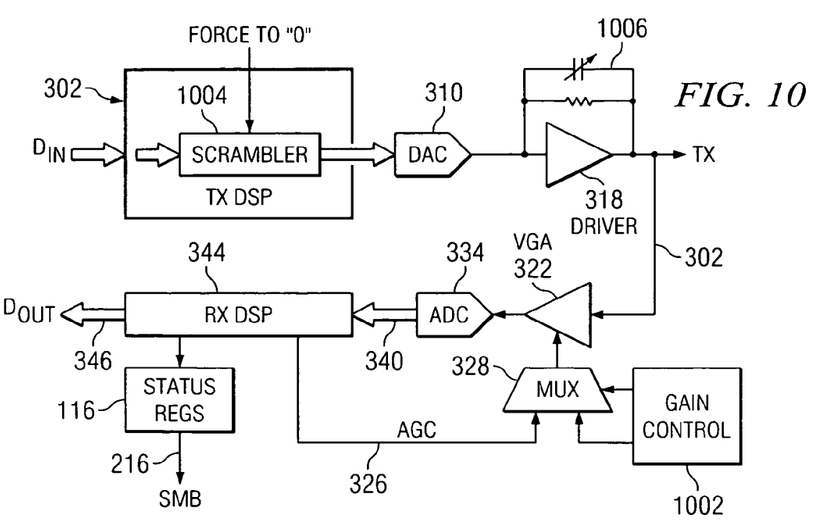
FIG. 10 illustrates a diagrammatic view of a configuration for the loopback test.

Referring now to FIG. 10, there is illustrated a diagrammatic view of the ALOOP test configuration. In this configuration, the output of the transmitter is routed back to the input of the receiver. As will be described hereinbelow, the feedback occurs for course, analog echo canceling. Thus, the output transmit signal is usually input to the receive input. In the loopback test, which is not an uncommon test, additional functions are implemented in the present disclosure. In a typical loopback test, data is merely input to the transmitter, looped back to the receiver and then a measurement made or data comparison is done. In the present disclosure, the additional aspect that is provided is accessed to various functional blocks within the DSP portion, i.e., the received DSP 344, to look at the state of various functional blocks, such as the coefficients of the echo canceller, the DC offset values and the DC canceller, etc. Additionally, certain functions such as the gain of the VGA can be forced to a predetermined value through control of the multiplexer 328 with a gain control block 1002. This test essentially exercises the entire analog front end. This is a dynamic test that is operable, in the disclosed embodiment, to utilize the transmit DSP 302 to generate a pseudo random sequence of pulses. This is facilitated with the scrambler 1004 that is operable to modulate the input with a random sequence of pulses. If the scrambler 1004 is forced to a "0" on the input thereof, a pseudo random sequence of pulses will still be output. However, the ALOOP test can be run with the input of the scrambler 1004 forced to a "0" value or any data can be input thereto. The primary aspect is that it be exercised with some data input such that data is output from the transmit DSP 302 and input to the DAC 310 for output on the transmit output of the driver 318. Additionally, the driver 318 has a programmable filter in the form of a variable capacitor 1006, which is described in the above-noted incorporated patent application. This programmable filter can have the parameters thereof changed for the test if desired.

Figure 11:
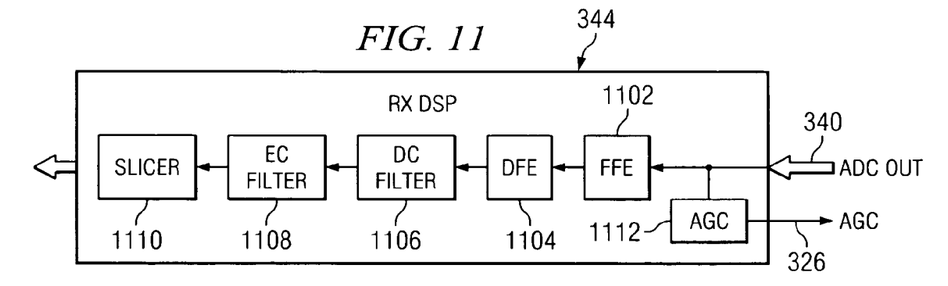
FIG. 11 illustrates a diagrammatic view of the receiver DSP.

Referring now to FIG. 11, there is illustrated a diagram of the receive DSP and the associated functional blocks, this number of functional blocks not being exhaustive, as there are other functional blocks in the operation thereof not illustrated. In the illustration of FIG. 11, the ADC output on bus 340 is processed through a Feed Forward Equalizer (FFE) block 1102, which is then processed through a block 1104 in order to remove echo and DC components. Block 1102 is comprised of an echo canceller 1108 and a DC filter 1106. The echo canceller 1104 is an adaptive filter that is operable to receive the pseudo random sequence from the scrambler 1004, and train on the received pulses based on the error signal "e" received from the slicer. The output of the block 1104 is input to a Decision Feedback Equalizer (DFE) and Viterbi decoder block 1110. All of these functional blocks 1102-1110 are well known functional blocks in the operation of the receive DSP 344. Additionally, there will be an AGC functional block 1112 that will output an AGC signal back to the multiplexer 328. All of these functional blocks can have registers associated therewith such that the operation thereof can be reviewed when data is looped back to the input of the VGA 322. Further, the gain of the VGA 322 can be forced to different levels during the operation thereof to determine operational characteristics, or in general the parametrics of operation for the analog front end and the digital components therebetween. Specifically, the ability to read the adaptive filter coefficients of the echo canceller 1108 provides valuable information during the test.

Figure 12:
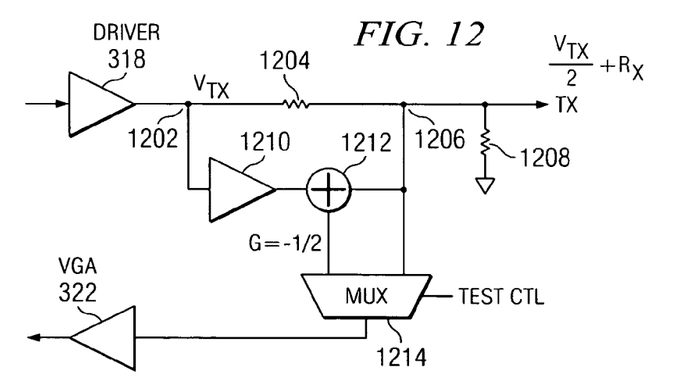
FIG. 12 illustrates a diagrammatic view of the loopback circuitry for feeding the output of the transmitter back to the receive input.

Referring now to FIG. 12, there is illustrated a block diagram of the interface between the output of the line driver 318 and the input of the VGA 322 on the receive side. The output of the line driver 318 provides an output on a node 1202 at a voltage of $V_{TX}$. This is input to one side of a load resistor 1204, the other side thereof connected to an output node 1206. Node 1206 is connected to one side of an external load 1208, the other side thereof connected to a reference ground potential. Resistor 1204 and resistor 1208 are each of a common value, typically 50 Ohms. As such, the value $V_{TX}$ on node 1202 will be divided by a factor of two to provide a voltage of $V_{TX}/2$. However, the node 1206 also provides the receive input function, such that any receive signal will be added to node 1206. Therefore, the voltage on the node 1206 will be $V_{TX}/2+R_X$.

The node 1206 is typically the receive input that is input of VGA 322. However, to provide some coarse echo canceling, the node 1202 is processed through a gain block 1210 and summed with the signal on node 1206 which is then input to the input of VGA 322. The output of gain block 1210 is input to a summation circuit 1212, which receives on the other input thereof the signal on node 1206. This is input to one input of a multiplexer 1214 that is controlled by a test control signal. The test control signal selects either the output of the summation circuit 1212 or the signal on node 1206. This allows the coarse echo canceling operation provided by the gain block 1210 to be bypassed. This will be utilized for the Template test, that will be described hereinbelow. The gain of the gain block 1210 is approximately −0.5.

Figures 13, 14, 15, 16:
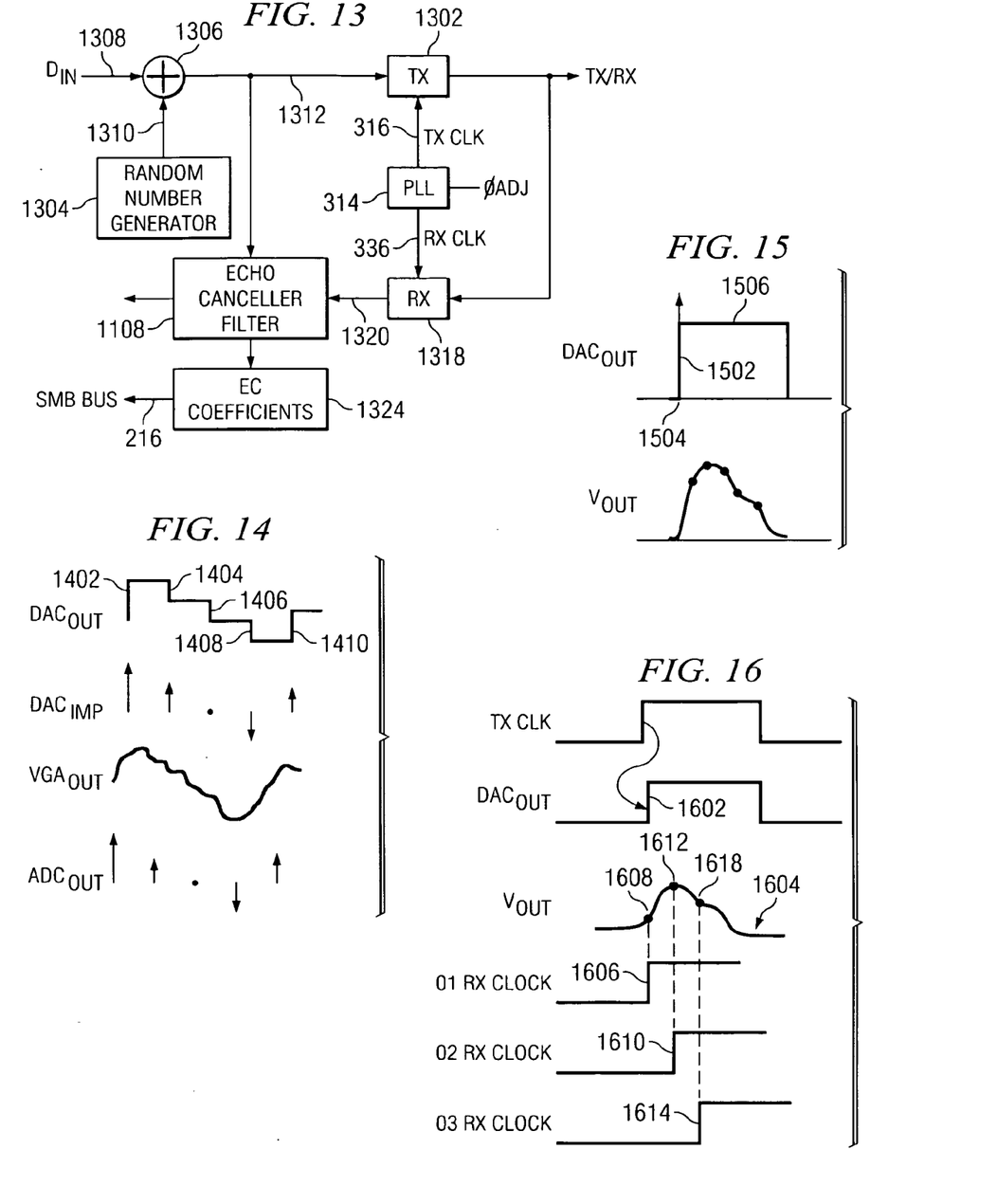
FIG. 13 illustrates a diagrammatic view of the scrambler and loopback interface.
FIG. 14 illustrates waveforms for the impulse response measured for the template test.
FIG. 15 illustrates a detail of the pulse output for a given output pulse.
FIG. 16 illustrates a further detail of the various phase differences between subsequent receive clocks for the template test.

Referring now to FIG. 13, there is illustrated a diagrammatic view for the Template test. As described hereinabove, the Template test is a dynamic test that loops back pulses as in the ALOOP test. However, the pseudo random sequence of pulses is utilized to train the echo canceling filter 1108 with a "virtual over sampled ADC," as will be described hereinbelow.

The transmit portion including portions of the Transmit DSP 302 and the DAC 310 and the line driver 318 are illustrated in a common block 1302. This is the portion of the transmit DSP 302 that follows the operation of the scrambler 1104 described hereinabove with reference to FIG. 10. The scrambler allows a pseudo random sequence of pulses to be generated and output on the transmit side. This pseudo random sequence of pulses is generated with a random number generator 1304 which are imposed upon the digital pulse train of the input data with a summation block 1306, which receives as one input, data input from the upstream portion of the digital chain on a bus 1308 and another input from the output of the random number generator 1304 on a bus 1310. This provides an output on a bus 1312 to the remaining portion of the transmit chain, including, among other blocks, the DAC 310 and line driver 318 (not shown). The DAC, as noted hereinabove with respect to FIG. 3, has the frequency thereof controlled by the transmit clock 316.

On the receive side, the receive chain portion including the VGA 322, the ADC 334 and other portions of the downstream chain are illustrated in a receive block 1318. This is operable to receive the receive input that is looped back from the transmit output 1302, it being noted that with the Template test, the multiplexer 1214 is controlled to bypass the coarse echo canceling portion of the interface circuitry between the transmit and receive sides. The output of the receive block 1318 is processed through the FFE 1102 (which is fixed for the Template and AFE tests, such that it appears like unity gain), and the echo canceller filter 1108 result subtracted from the output thereof. The echo canceller 1108 is an adaptive digital filter that is operable to receive the output of the transmit encoder and the slicer error result, and trains so as to minimize the slicer error result. The purpose of the echo canceller filter 1108 is well known in the art, and is operable to cancel any contribution to the received data to an approximately "0" value. Since the receive data is only transmitted data, then the impulse response of the AFE system will be reflected in the filter coefficients of the echo filter 1108. This in effect models the impulse response of the portion of the transmitted signal that is fed back to the receive input. These filter coefficients are adaptively generated based upon the slicer error result and are stored in a block 1324. In the test mode, these coefficients can be viewed and output on the SMI bus 210, as described hereinabove. Note that the FFE 1102 is fixed for this test, since it is desirable not to have any filtering in the DSP. If filtering were present due to the operation of the FFE, it would interfere with the received pulses.

In operation of the system in the loopback, the input data is forced to a "0" value on the input bus 1308 such that the output is comprised of the randomly generated pulses output by the random number generator 1304. A waveform of the output pulses associated with this operation is illustrated in FIG. 14. A first waveform illustrates a DAC output waveform that results from, for example, a first DAC output of the voltage level of +2.0 volts at an edge 1402, and at the next sample time it falls to a voltage level of 1.25 at an edge 1404 and then at the next sample time, it falls to a value of zero at an edge 1406, and then at a next sample time, it falls to a voltage level of −1.0 at an edge 1408 and then rises to a level of 0.75 at an edge 1410. The sequence of DAC input impulses is illustrated in the next waveforms. The DAC and driver output signal is input to the VGA 322. The output of the VGA 322 will have an analog waveform and shape that, of course, due to the various filtering steps, etc., will not appear the same as the output of the DAC 310. The output of the ADC is illustrated in the bottom curve of FIG. 14, this typically being similar to the input impulse sequence of the DAC.

Referring now to FIG. 15, there is illustrated a detail of a single impulse response to a change in a data level due to a data transition. This is represented by a first plot of a data pulse having a transition 1502 from a first voltage level 1504 to a second voltage level 1506. This results in the output of an analog voltage that is a function of the various filter responses through the interface between the DAC 310 and the line driver 318, the response of the line driver 318 and the response of the VGA 322. This results in a "pulse" as set forth in the lower waveform of FIG. 15. The standard for the Gigabit Ethernet is set forth in IEEE 802.3xx, this Gigabit Ethernet also termed 1000BASE-T. This pulse that is generated in response to a data transition on the output of the DAC is required to have a certain shape. In order to measure the dynamic response of the system by looking at the shape of the pulse in prior art systems, it is necessary to utilize a very fast ADC that is over sampled in order to determine the shape of the pulse. However, the ADC 334 will only provide one or possibly two samples for each data transition in the DAC output and can not be utilized as in the prior art. In order to utilize existing circuitry in the transceiver of the present disclosure, the ADC 334 is not operated in an over sampled mode but, rather, operated such that the delay between the transmit clock and the receive clock is varied. For each measurement, the phase of the receive clock is set to a predetermined relationship with respect to the transmit clock. The pseudo random number generator then generates data by forcing the input value to "0." This random sequence of pulses is then adapted to the echo canceller 1108 with the loopback pulses such that the error at the slicer output is forced to zero. This requires that the impulse response of the echo canceller 1108 be the same as the impulse response of the AFE system so as to filter this information out. Therefore, once a sequence of pulses is generated, the echo canceller filter 1108 will "adapt" to this pulse stream and the impulse response for that one value will provide a point of data relative to the edge 1502. Thus, it is then only necessary to increment the phase of the receive clock and then take another data point by examining the echo canceller filter coefficients in the register 1324 for that point. In effect, this provides a virtual over sampled ADC utilizing an ADC that operates at a non-over sampled clock rate.

Referring now to FIG. 16, this is illustrated in more detail the phase changing operation. The transmit clock operates at a predetermined frequency such that the output of the DAC provides a transition 1602 that is generated in response to the transmit clock transition, i.e., the DAC output is synchronized to the transmit clock. The transmit clock, as described herein above, is synchronized to a reference clock signal with the PLL 314. The receive clock is also synchronized with the reference clock, as it is generated by the PLL 314. The only difference is that it can have a phase offset with respect to the transmit clock. An output waveform 1604 will result from generation of a DAC output pulse, in this case a positive going pulse. The receive clock is offset from the transmit clock in the test mode, this being a "forced" offset. In a first measurement, an operation will be evaluated at a value of the delay of $\phi 1$. There will be a clock edge 1606 that will be utilized to determine the response of the AFE system corresponding to a point 1608 on the pulse 1604. A second receive clock will then be generated after this first response is determined (this determined after the echo canceller 1108 adapts to the input receive signal), in association with the actual point 1608 on the waveform 1604. This phase is then changed to a second phase, $\phi 2$, at a receive clock edge 1610. This clock at edge 1610 will result in a determination of a response embedded within the coefficients of the echo canceller 1108 that corresponds to a point 1612 on the waveform 1604 at another point delayed in time from the edge 1602. In this example, a third phase change, $\phi 3$, is made to result in another phase delay for the clock edge 1614 for the receive clock. This will result in a determination of the response at this delay, which corresponds to a point 1618 on the curve 1604. Therefore, with the use of the phase shifting on a forced basis of the receive clock relative to the transmit clock and the ability to examine the filter coefficients for the echo canceller and also the ability to provide input data, either forced to "0" or an external input data and the ability to force the FFE to constant gain, a determination can be made of the pulse shape which is quantized at the ADC. This is virtually equivalent to an over-sampled ADC measurement system.

Figures 17, 18:
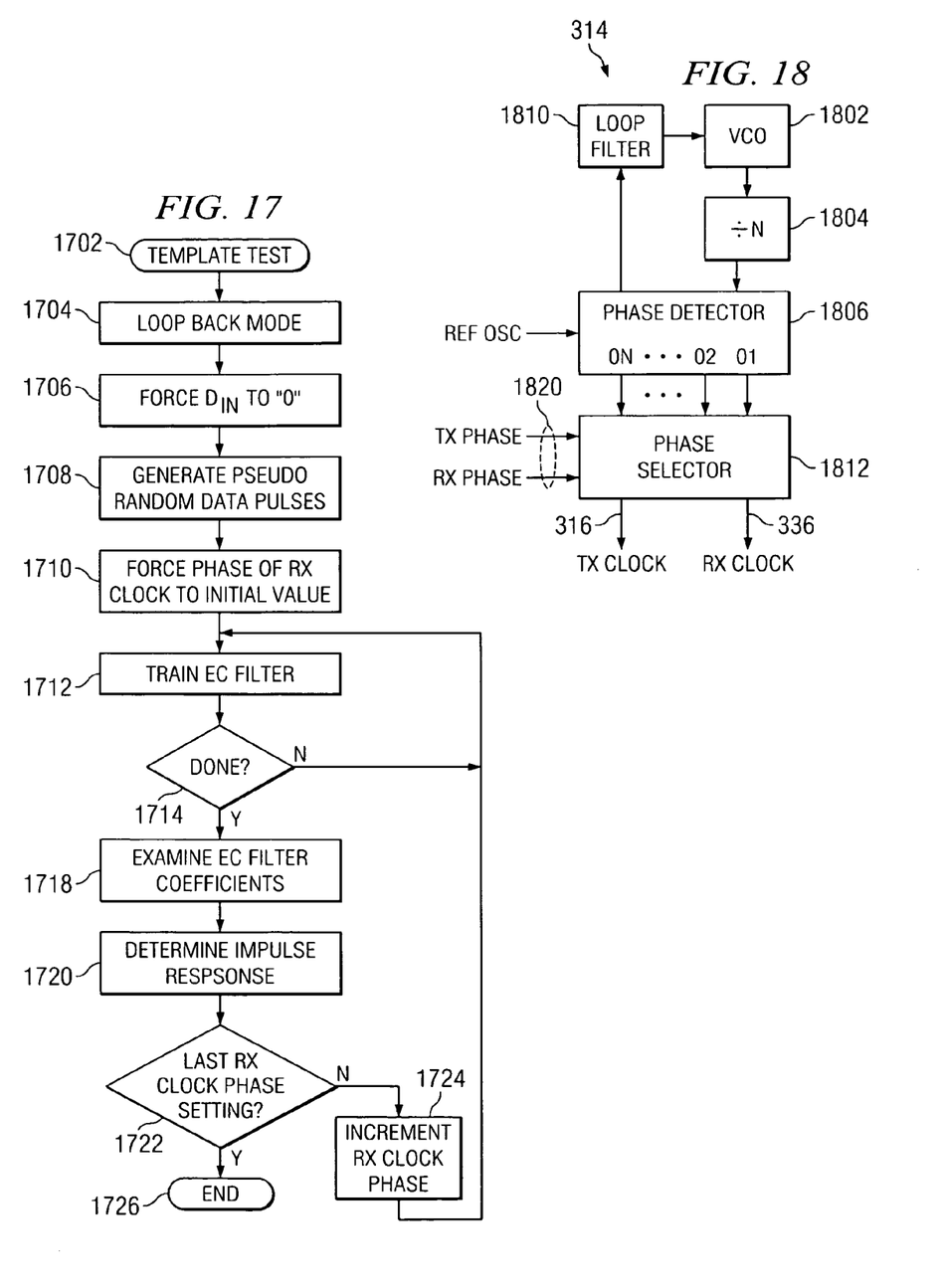
FIG. 17 illustrates a flow chart for the template test.
FIG. 18 illustrates a diagrammatic view of the phase lock loop.

Referring now to FIG. 17, there is illustrated a flow chart for the Template test, which is initiated at a block 1702. The program then flows to a function block 1704 into a loopback mode, which, in a Template test, requires the multiplexer 1214 to bypass the coarse echo canceling. The program then flows to a function block 1706 to force the data input to a "0" value. However, as described hereinabove, data could be input at a predetermined level. The program then flows to a function block 1708 to generate the pseudo random data pulses, this generated during normal operation of the transmit DSP 302 with a "0" input data value or any data value. This will generate pulses for the purpose of looping back to the receive input. The program then flows to a function block 1710 wherein the phase of the receive clock is forced to an initial phase offset value from the transmit clock. The program then flows to a function block 1712 to train the echo canceller filter 1108 such that the coefficients of the filter will reflect the system (AFE) impulse response. The program then flows to a decision block 1714 to determine if the echo canceller has completed this operation. If not, the program will flow along a "N" path back to the input of function block 1712. When the echo canceller filter 1108 adapts, the program will flow along a "Y" path to a function block 1718 to examine the echo canceller filter coefficients in the register 1324. At this point, the EC coefficients represent the impulse response of the AFE system. The program will then flow to a decision block 1722 in order to determine if the receive clock phase setting, i.e., the offset, is the last in the test sequence. This test sequence, as noted herein above, will go from an initial setting to a final setting in predetermined increments. If not, the program will flow along a "N" path to a function block 1724 to increment the receive clock phase and then back to the input of function block 1712 to again determine the impulse response of the system at that phase setting. When all of the phase settings have been sequenced through for the receive clock offset, the program will flow from decision block 1720 to along a "Y" path to an END block 1726.

Referring now to FIG. 18, there is illustrated a block diagram of the phase lock loop 314. The phase lock loop has a central primary voltage controlled oscillator 1802 that is placed into a PLL loop. The oscillator 1802 is referred to as a "VCO." The VCO 1802 has the output thereof divided in a variable divider circuit 1804 which output is input to a phase detector block 1806. The phase detector 1806 compares the phase of the divided clock to a reference oscillator and determines an error in phase therebetween. This error is then filtered by a loop filter 1810 to generate an error voltage to the input of the VCO 1802 to vary the phase and frequency thereof. When the error goes to "0" or to some predetermined offset, the VCO divided output of the VCO 1802 will then be locked to the reference oscillator.

The VCO 1802 operates by providing a plurality of incremental phase outputs. These phase outputs are "tap" phase outputs that are input to a phase selector 1812. This phase selector outputs one phase of the VCO clock, which may have been divided down. Additionally, there could be an additional stage of division to provide a locked clock. The phase selector 1812 has the ability to select one of the multiple phases of the locked clock as an output for the receive clock on the receive clock line and a transmit clock on a transmit clock line 316. This is provided by two control lines 1820, one for the transmit phase and one for the receive phase. Typically, the transmit phase is a preset phase associated with the locked clock whereas the receive clock phase can be varied. During normal operation, the receive clock in the slave transceiver will be varied to synchronize in phase with the transmit clock recovered from the data transmitted from the master transceiver. However, at the slave transceiver, the receive clock is synchronized with data received from the master transceiver and the transmit clock 316 is synchronized with the receive clock in a slave transceiver. This is a conventional operation.

Although the preferred embodiment has been described in detail, it should be understood that various changes, substitutions and alterations can be made therein without departing from the spirit and scope of the invention as defined by the appended claims.

What is claimed is:

1. A method for testing the operation of a transceiver having a digital processing section and an analog section, each having a transmit portion and a receive portion, the transmit and receive portions of the analog section adaptable to interface with an analog network, the method comprising:
configuring the analog section to operate in a test mode;
providing a control signal to the digital section;
in the test mode that operates apart from a normal operating mode, activating the transmit portion of the digital processing section, responsive to the control signal, to generate test data to be transmitted by the transmit portion of the analog section;
operating the receive portion of the analog section and the receive portion of the digital processing section to receive the test data; and
examining parametrics of select portions of the receive portion of the digital processing section during the receipt of the test data by the receive portion of the analog section and processing received data by the receive portion of the digital processing section.

2. The method of claim 1 wherein a portion of transmitted data output by the transmit portion of the analog network is input to the receive portion of the analog section during the test mode.

3. The method of claim 2, further comprising interfacing the output of the transmit portion of the analog network with the input of the receive portion of the analog section in a loopback mode.

4. The method of claim 3, wherein the interfacing is operable to directly connect the output of the transmit portion of the analog network to the input of the receive portion of the analog section.

5. The method of claim 1, wherein the receive portion of the analog section has associated therewith an analog receiver having a variable gain and being operable during the normal operating mode to be controlled by an automatic gain control function of the receive portion of the digital processing section, and the method further comprising forcing the gain of the analog receiver to a predetermined gain during the test mode.

6. The method of claim 5, wherein the gain of the analog receiver is forced to a plurality of different gain settings during the test mode.

7. The method of claim 6, wherein the receive portion of the digital processing section has associated therewith a DC offset correction function and the method further comprising generating on the output of the transmit portion of the analog section a DC voltage and examining the parametrics of select portions of the receive portion of the digital processing section operable to examine the parametrics of the DC offset correction function to determine the DC offset that corresponds to the DC voltage.

8. The method of claim 7, wherein the gain of the analog receiver is varied over a plurality of gain settings and the corresponding DC offset is determined for each of the plurality of gain settings, wherein the digital processing section has associated therewith an analog-to-digital converter (ADC) connected to the output of the analog receiver, and determination of the DC offset over a plurality of gain settings for the analog receiver provides an indication that the ADC operates correctly at different DC output values from the analog receiver.

9. The method of claim 8, wherein the generating on the output of the transmit portion of the analog section a DC voltage comprises generating a plurality of different DC voltages for each gain setting of the analog receiver, and the corresponding DC offset is determined for each of the plurality of gain settings and DC voltages.

10. The method of claim 7, wherein the generating on the output of the transmit portion of the analog section a DC voltage comprises generating a plurality of different DC voltages, and wherein the digital processing section has associated therewith an analog-to-digital converter (ADC) connected to the output of the analog receiver, and determination of the DC offset over a plurality of different DC voltages input to the analog receiver provides an indication that the ADC operates correctly at different DC output values from the analog receiver.

11. The method of claim 1, wherein the transmit portion of the digital processing section has associated therewith a digital-to-analog converter (DAC) and the receive portion of the digital processing section has associated therewith an analog-to-digital converter (ADC), and the digital processing circuitry having associated timing circuitry for generating clocks for the ADC and DAC and, during the test mode, comprising operating the clock for the ADC at preset phases relative to the clock for the DAC for multiple sequential test operations of the transceiver with different phases.

12. The method of claim 11, wherein the transmit portion of the digital processing section is operable to output a plurality of digital pulses of different digital values in a pseudo random sequence, which results in a transmitted pulse received by the receive portion of the analog section.

13. The method of claim 12, wherein the receive portion of the digital processing section has associated therewith an echo canceller filter that is operable to train to a shape of the received pulse, the echo canceller having associated therewith filter coefficients, and the-examining the parametrics of select portions of the receive portion of the digital processing section comprises examining the filter coefficients of the echo canceller.

14. The method of claim 1, wherein the receive portion of the digital processing section has associated therewith a DC offset correction function and the method further comprising generating on the output of the transmit portion of the analog section a DC voltage, and examining the parametrics of select portions of the receive portion of the digital processing section operable to examine the parametrics of the DC offset correction function to determine the DC offset that corresponds to the DC voltage.

15. A transceiver capable of operating in a normal mode and in a test mode for testing operation of the transceiver, the transceiver comprising:
an analog section having an analog transmit portion and an analog receive portion each adaptable to interface with an analog network;
a digital processing section having a digital transmit portion and a digital receive portion;
a built-in self test block providing a control signal to the digital processing section; and
a media dependent interface coupled to the built-in test block to the analog section and to the digital processing section,
wherein the analog section includes:
a network connector coupled to the media dependent interface and capable of being connected to the analog network;

wherein the digital processing section includes:
- a plurality of functional blocks coupled to the built-in self test block and to the media dependent interface, the plurality of functional blocks capable of operating in the normal mode for performing normal digital transmit functions, wherein the plurality of functional blocks are adapted for receiving the control signal from the built-in self test block, and wherein the plurality of functional blocks are capable of being reconfigured for operation in the test mode for generating test data to be transmitted by the analog transmit portion in response to the control signal.

16. The transceiver of claim 15, further comprising:
- a system management interface coupled to the digital processing section for coupling the digital processing section to a media access controller;
- a system management bus coupled to the digital processing section; and
- a buffer coupled to the digital processing section through the system management bus, the buffer being utilized during the test mode.

17. The transceiver of claim 16,
wherein the digital processing section further includes a plurality of registers for operating during the test mode, one or more of the registers associated with each of the functional blocks, and
wherein the plurality of registers are accessible by the system management interface during the normal mode.

18. The transceiver of claim 16, wherein operating in the test mode includes performing a DC test to check for linearity of transmission and reception, offset, gain, and digital to analog conversion faults and analog to digital conversion missing codes.

19. The transceiver of claim 16,
wherein operating in the test mode includes performing a dynamic test by transmitting a pseudo random sequence of pulses and looping back the pseudo random sequence of pulses to the digital receive portion, and
wherein the functional blocks include an adaptive echo filter operable to train to a shape of pulses of the pseudo random sequence of pulses received at the digital receiver portion.

20. The transceiver of claim 19, wherein the digital receiver portion further compares coefficients of the echo filter to a prescribed template to validate dynamic behavior of a transmit path through the digital transmit portion and the analog transmit portion, a receive path through the digital receive portion and the analog receive portion and the echo filter.

* * * * *